United States Patent
Pierrat

(10) Patent No.: US 8,252,693 B1
(45) Date of Patent: Aug. 28, 2012

(54) SELF-ALIGNMENT FOR SEMICONDUCTOR PATTERNS

(75) Inventor: Christophe Pierrat, Santa Clara, CA (US)

(73) Assignee: Cadence Design Systems, Inc., San Jose, CA (US)

(*) Notice: Subject to any disclaimer, the term of this patent is extended or adjusted under 35 U.S.C. 154(b) by 0 days.

(21) Appl. No.: 13/015,514

(22) Filed: Jan. 27, 2011

Related U.S. Application Data

(62) Division of application No. 12/361,407, filed on Jan. 28, 2009, now Pat. No. 7,902,613.

(60) Provisional application No. 61/024,140, filed on Jan. 28, 2008, provisional application No. 61/024,144, filed on Jan. 28, 2008.

(51) Int. Cl.
*H01L 21/311* (2006.01)

(52) U.S. Cl. ... 438/700; 438/687; 438/735; 257/E21.32; 257/21.231; 257/E21.304; 257/E21.545; 257/E21.548; 257/E21.585

(58) Field of Classification Search .................. 438/700, 438/553, 687, 688, 692, 735, 736; 257/E21.32, 257/E21.231, E21.304, E21.545, E21.548
See application file for complete search history.

(56) References Cited

U.S. PATENT DOCUMENTS

| | | | |
|---|---|---|---|
| 6,288,679 B1* | 9/2001 | Fischer et al. | 343/700 MS |
| 7,902,613 B1* | 3/2011 | Pierrat | 257/396 |

* cited by examiner

*Primary Examiner* — David Nhu
(74) *Attorney, Agent, or Firm* — Kenyon & Kenyon LLP

(57) ABSTRACT

Various systems and methods related to semiconductor devices having a plurality of layers and having a first conductive trace on a first layer electrically connected to a second conductive trace on a second layer and electrically isolated from a third electrical trace on the second layer are provided. A semiconductor structure can include first, second and third layers. The first conducting layer may be etched to form a first trench for the first conductive trace. A layer of material on the second layer in the first trench can define a patch area, wherein the patch area is disposed in a location where the first trench crosses over the third electrical trace. A second trench may be etched in an area defined by the first trench and the patch area to remove material in the second layer exposed by the first trench, leaving material of the layer under the patch area.

8 Claims, 15 Drawing Sheets

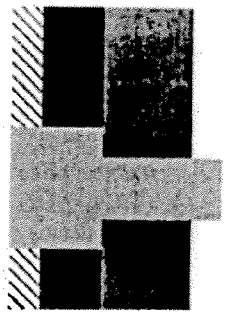

Assumptions
Cu Cap Height = 25nm
Hardmask height = 25nm
Via height = 110nm
Trench height = 125nm
Minimum L/S = 70nm

Assumptions
$K_{(Cu\,Cap)}$ = 3.5
$K_{(Hardmask)}$ = 2.5
$K_{(via)}$ = 2.2
$K_{(trench)}$ = 2.0
$K_{eff}$ = 2.31

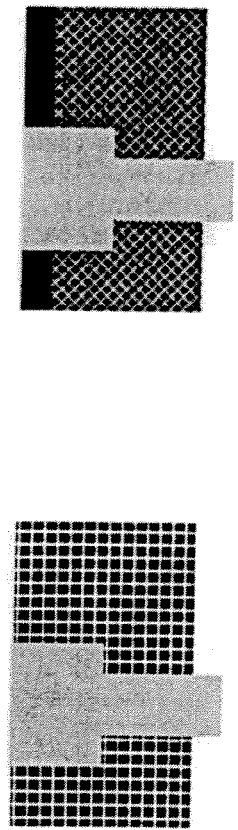

Assumptions
Cu Cap Height = 25nm
Hardmask height = 25nm
Via height = 110nm
Trench height = 125nm
Minimum L/S = 70nm

Assumptions
$K_{(Cu\,Cap)}$ = 3.5
$K_{(Hardmask)}$ = 2.5
$K_{(via)}$ = 2.2
$K_{(trench)}$ = 2.2
$K_{eff}$ = 2.40

Assumptions
Cu Cap Height = 25nm
Hardmask height = NA
Via height = 110nm
Trench height = 125nm
Minimum L/S = 70nm

Assumptions
$K_{(Cu\,Cap)}$ = 3.5
$K_{(Hardmask)}$ = NA
$K_{(via)}$ = 2.4
$K_{(trench)}$ = 2.4
$K_{eff}$ = 2.54

*Fig. 2C*

SELF-ALIGNMENT FOR SEMICONDUCTOR PATTERNS

CROSS-REFERENCED TO RELATED APPLICATIONS

This application is a divisional of and claims the benefit of U.S. patent application Ser. No. 12/361,407 filed Jan. 28, 2009, now issued as U.S. Pat. No. 7,902,613, which claims the benefit of U.S. Provisional Patent Application Nos. 61/024,140 and 61/024,144 both of which were filed Jan. 28, 2008. The foregoing applications are hereby incorporated herein by reference in their entirety.

TECHNICAL FIELD

The present invention relates to device manufacturing, and more particularly, some embodiments relate to semiconductor device patterning techniques.

DESCRIPTION OF THE RELATED ART

Integrated circuits, or ICs, are generally created by patterning a plurality of devices and their interconnects onto a substrate such as a semiconductor wafer. This process generally starts with a design for the circuit or circuits that will make up the IC. A top-down design methodology is commonly employed using hardware description languages through which the designer creates an integrated circuit by hierarchically defining functional components of the circuit. From this high-level functional description, a physical circuit implementation dataset is created, which is usually in the form of a netlist. This netlist identifies logic cell instances from a target standard cell library, and describes cell-to-cell connectivity.

A layout file is then created using the netlist. This is accomplished through a layout and routing process, which assigns logic cells to physical locations in the device layout and routes their interconnections. This layout can be transferred or applied to the semiconductor substrate in a series of layers that collectively form the devices that make up the components of the integrated circuit. A process by which such layers are patterned on the substrate is known as photolithography. During photolithography, a series of photomasks created from the layout file are used to transfer the layout onto the substrate layer by layer. A photomask, or mask, provides an image of the physical geometries of its respective integrated circuit layer. Passing light through transparent sections defined by the mask elements transfers the layout pattern for the layer onto the wafer. An imaging lens system projects and focuses the layout onto the substrate at the desired size. The projected light pattern interacts with a photosensitive coating on the wafer and, depending on the coating used, it is cured or rendered susceptible to removal in the areas that were exposed to the light. Accordingly, the projection of the mask pattern onto the coating can be used to transfer the pattern to the wafer.

With a continuing desire to provide greater functionality in smaller packages and the evolution of system-on-chip and mixed-signal designs, IC feature geometries are being driven to smaller and smaller dimensions. However, the ability to project an accurate image of increasingly smaller features onto the wafer is limited by the wavelength of the light used, and the ability of the lens system to capture enough diffraction orders from the illuminated mask. The minimum feature size that a projection system can print can be approximated by:

$$F = k1 * \frac{\lambda}{N_A}$$

where F is the minimum feature size, k1 is a coefficient of process-related factors, $\lambda$ is the wavelength of light used and $N_A$ is the numerical aperture of the lens as seen from the wafer. With lithography processes using deep ultraviolet light with wavelengths of 248 to 193 nm, minimum feature sizes of approximately 50 nm can be achieved. Accordingly, the resolution limit of conventional lithography technology is increasingly being challenged by the shrinking dimensions of critical IC feature geometries.

Not only are the critical feature geometries decreasing in accordance with, or even faster than, Moore's Law predictions, the already large number of these feature geometries is growing at a dramatic rate as well. Conventional dual Damascene processes can be particularly challenging especially with smaller and smaller geometries. The lithography operations for real levels can be quite challenging and there is very limited process latitude in the printing of small vias. Additionally, with small via sizes impurities can lead to high resistivity or other connectivity issues and the placement of the vias with respect to the metal levels becomes more and more critical as the width of the metallization lines decreases.

BRIEF SUMMARY OF EMBODIMENTS OF INVENTION

According to various embodiments of the invention, semiconductor devices and systems and methods for manufacturing semiconductor devices are provided. In one embodiment, a method is provided for manufacturing a semiconductor having a plurality of layers and having a first conductive trace on a first layer electrically connected to a second conductive trace on a second layer and electrically isolated from a third electrical trace on the second layer. The method can include: forming a semiconductor structure comprising first, second and third layers; etching the first conducting layer to form a first trench for the first conductive trace; patterning a layer of material on the second layer in the first trench to define a patch area on the second layer, wherein the patch area is disposed in a location at which the first trench crosses over the third electrical trace; and etching a second trench in the second layer in an area defined by the first trench and the patch area to remove material in the second layer exposed by the first trench while leaving material of the layer under the patch area.

The method can further include filling the first and second trenches with conductive material to form the first conductive trace and an interconnect between the first and second conductive traces. In some embodiments, the patch provides electrical isolation between the conductive material in the first and second trenches and the third conductive trace in the third layer. The patch can range in sizes to provide a desired or appropriate level of electrical isolation between the first and third traces. For example, the patch area can comprises an area approximately 400% of the area of overlap between the first and third electrical aces. As another example, the patch are comprises an area in the range of approximately 150% to 800% of the area of overlap between the first and third electrical traces.

In another embodiment, the first layer further comprises a hardmask layer disposed thereon and the hardmask layer confines the step of etching the second trench to the area defined by the first trench.

In yet another embodiment, a method is provided for manufacturing a semiconductor device having a plurality of layers and having a first conductive trace on a first layer electrically connected to a second conductive trace on a second layer and electrically isolated from a third electrical trace on the second layer, the method including: patterning a first conductive element on the first layer of a semiconductor device; patterning second and third conductive elements on the second layer of a semiconductor device; forming a patch at a predetermined location between the first and third conductive elements; and forming an electrical connection in the second layer of the semiconductor device at a predetermined location between the first and the second conductive elements, wherein the patch limits the extent of the electrical connection thereby electrically isolating the first and third conductive elements.

In one application, the steps of patterning and forming include etching the first conducting layer to form a first trench for the first conductive trace; patterning a layer of material on the second layer in the first trench to define a patch area on the second layer, wherein the patch area is disposed in a location at which the first trench crosses over the third electrical trace; etching a second trench in the second layer in an area defined by the first trench and the patch area to remove materiel in the second layer exposed by the first trench while leaving material of the layer under the patch area; and filling the first and second trenches with conductive material to form the first conductive trace and an interconnect between the first and second conductive traces.

In still another embodiment, a semiconductor device includes: a first conductive element on a first layer of the semiconductor device; second and third conductive elements on a second layer of the semiconductor device; and an electrical connection in a third layer of the semiconductor device disposed at a location between the first and second conductive elements; and a patch in the third layer disposed at a position where the first conductive element passes over the second conductive element, wherein the patch limits the extent of the electrical connection thereby electrically isolating the first and third conductive elements.

In yet another embodiment, a computer aided design tool is provided for designing a semiconductor device having a plurality of layers and having a first conductive trace on a first layer electrically connected to a second conductive trace on a second layer and electrically isolated from a third electrical trace on the second layer, the design tool including: a processor; a memory, coupled to the processor and configured to store instructions, the instructions causing the processor to define a dataset used to create a first photomask pattern to define a first trench in the first layer for the first conductive trace; a second photomask pattern to define to define a patch area on the second layer, wherein the patch area is disposed in a location at which the first trench crosses over the third electrical trace; wherein the patterns define a second trench in the second layer to remove material in the second layer exposed by the first trench while leaving material of the layer under the patch area. In one embodiment, the patch provides electrical isolation between the conductive material in the first and second trenches and the third conductive trace in the third layer.

In another embodiment, a computer program product comprises a computer readable storage medium having computer readable program code embodied therein, the computer readable program code configured to cause a processor to define a dataset used to create a first photomask pattern to define a first trench in the first layer for the first conductive trace; and define a dataset used to create a second photomask pattern to define to define a patch area on the second layer, wherein the patch area is disposed in a location at which the first trench crosses over the third electrical trace; wherein the patterns define a second trench in the second layer to remove material in the second layer exposed by the first trench while leaving material of the layer under the patch area.

Other features and aspects of the invention will become apparent from the following detailed description, taken in conjunction with the accompanying drawings, which illustrate, by way of example, the features in accordance with embodiments of the invention. The summary is not intended to limit the scope of the invention, which is defined solely by the claims attached hereto.

BRIEF DESCRIPTION OF THE DRAWINGS

The present invention, in accordance with one or more various embodiments, is described in detail with reference to the following figures. The drawings are provided for purposes of illustration only and merely depict typical or example embodiments of the invention. These drawings are provided to facilitate the reader's understanding of the invention and shall not be considered limiting of the breadth, scope, or applicability of the invention. It should be noted that for clarity and ease of illustration these drawings are not necessarily made to scale.

Some of the figures included herein illustrate various embodiments of the invention from different viewing angles. Although the accompanying descriptive text may refer to such views as "top," "bottom" "side" views, such references are merely descriptive and do not imply or require that the invention be implemented or used in a particular spatial orientation unless explicitly stated otherwise.

FIGS. 2A, 2B, and 2C are diagrams illustrating a conventional dual damascene copper interconnect assumptions for 90 nm, 65 nm, and 45 nm technologies, respectively.

The figures are not intended to be exhaustive or to limit the invention to the precise form disclosed. It should be understood that the invention can be practiced with modification and alteration, and that the invention be limited only by the claims and the equivalents thereof.

DETAILED DESCRIPTION OF THE EMBODIMENTS OF THIS INVENTION

The present invention relates to device manufacturing, and more particularly, some embodiments relate to semiconductor device patterning techniques. According to various embodiments of the invention, systems and methods for manufacturing semiconductor device may include forming a conducting structure. The conducting structure can include first and second conducting levels. The first conducting level may be etched. In various embodiments, a patch can be defined to block connection between the first and second conductive levels. The patch may have an area smaller than perhaps 5000% to 100% of the overlap between a pair of conductive traces to be blocked. In some embodiments, the second conductive level can be etched to remove a portion of the second conductive layer, not aligned with the patch. A connection may be formed between the first and the second conducting levels in a location not covered by the patch. Some embodiments may use a dual damascene process is used to form the semiconductor. Additionally the conducting levels may be metal and the patch can be a dielectric material.

The present invention is directed in various embodiments toward semiconductor devices and systems and methods for semiconductor processing. Particularly, some embodiments relate to an alignment or connection of metal layers in a semiconductor stack.

Figure 1:
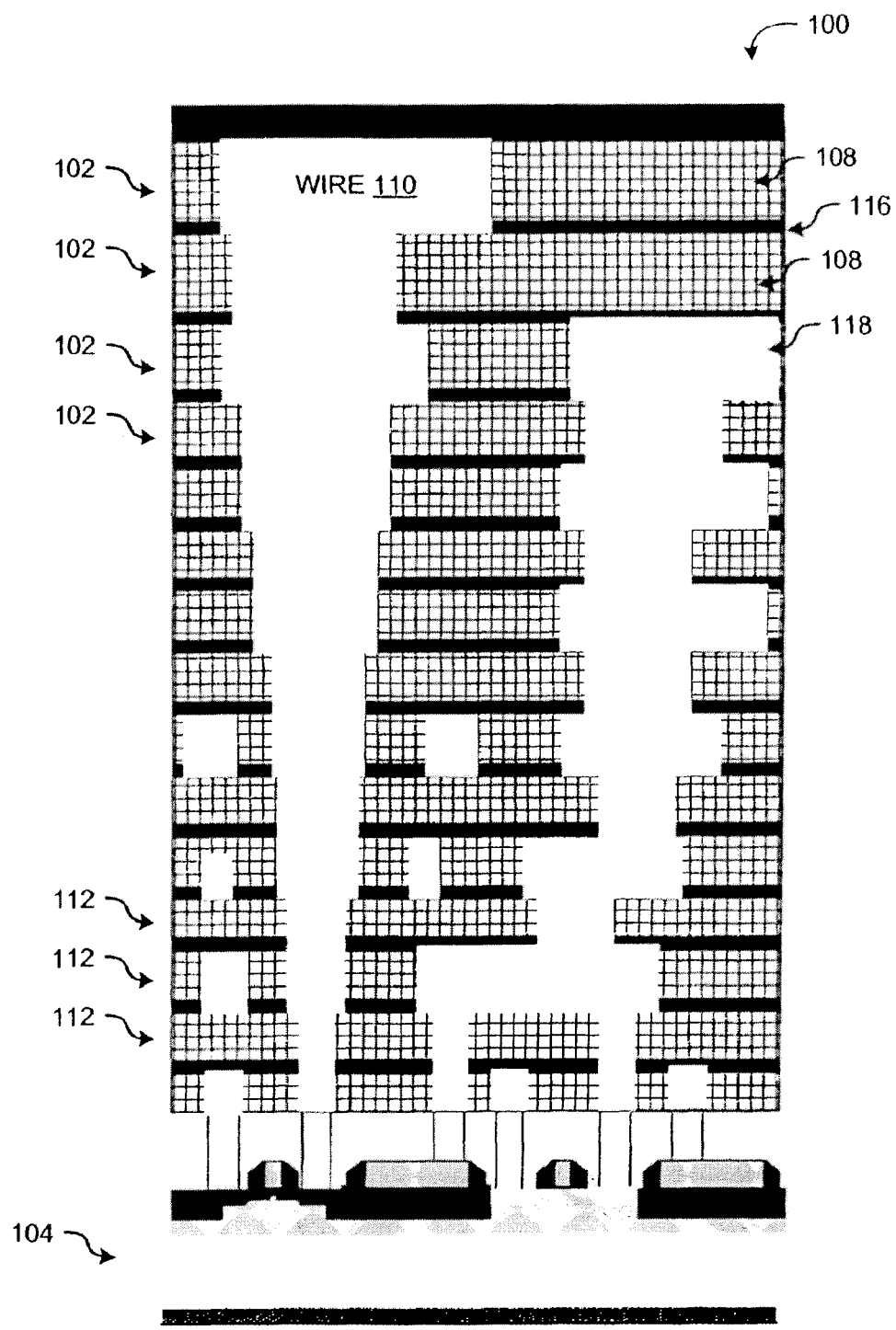
FIG. 1 is a diagram illustrating a cross-sectional view of an example semiconductor device.

FIG. 1 is a diagram illustrating a cross-sectional view of an example semiconductor device 100. As this example illustrates, a semiconductor device 100 is typically fabricated with a plurality of layers 102 of material on top of a semiconductor substrate 104. The semiconductor substrate 104 is typically doped to create n and p regions to form devices such as, for example, transistors in the semiconductor substrate 104. Conductive pads can be applied (for example, at the gate, drain and source) to allow electrical connections thereto. The contacts of the devices 100 are interconnected with conductive metals such as aluminum or copper to form circuits. The interconnects between devices are fabricated by forming a plurality of metallization layers 106 in which the conductive interconnects lie. Vias can be included to provide interconnections between conductive elements in different layers. In some embodiments, layers include dielectric material 108, with metal traces 110 therein and can be separated by intermediate layers 112 such as hard mask or etch stop materials. The intermediate layers 112 can be used to better control the etch process. Various embodiments can also include dielectric capping layers 114, etch stop layers 116, and copper conductors with barrier/nucleation layers 118. In some embodiments, a passivation layer 120 may also be applied to the semiconductor device 100.

Figure 2A:
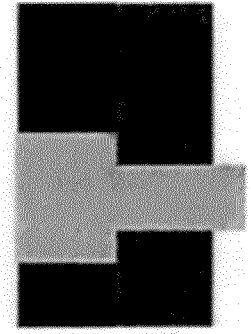
Figure 2A:
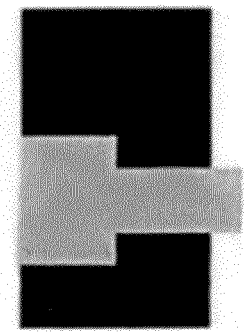
Figure 2A:
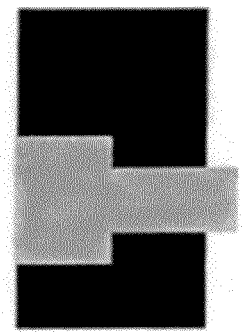
Figure 2B:
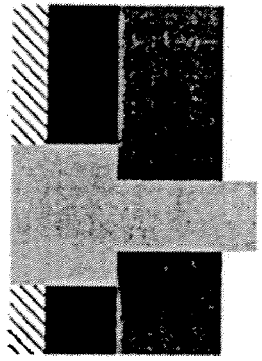
Figure 2B:
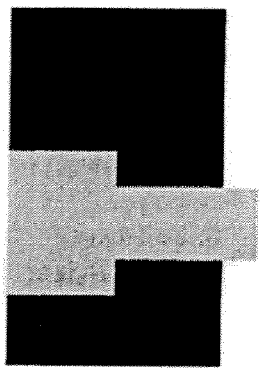
Figure 2B:
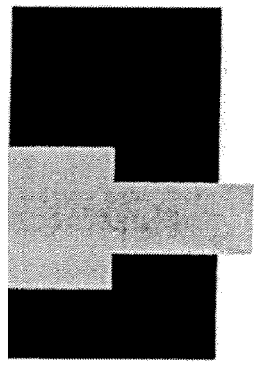

FIGS. 2A, 2B, and 2C are diagrams illustrating dual damascene copper connect assumptions for 90 nm, 65 nm, and 45 nm technologies, respectively. These each assume Cu metal with various dielectric options, and scaling of minimum feature size, via height, trench height and hardmask thickness.

Figure 3:
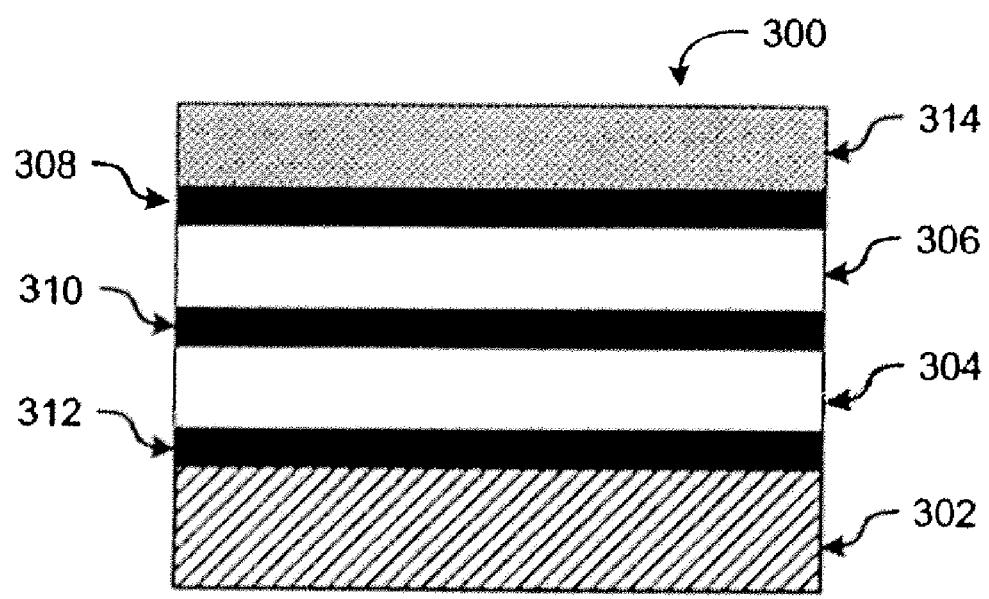
FIG. 3 is a diagram illustrating a traditional dual damascene process in accordance with the systems and methods described herein.
Figure 4:
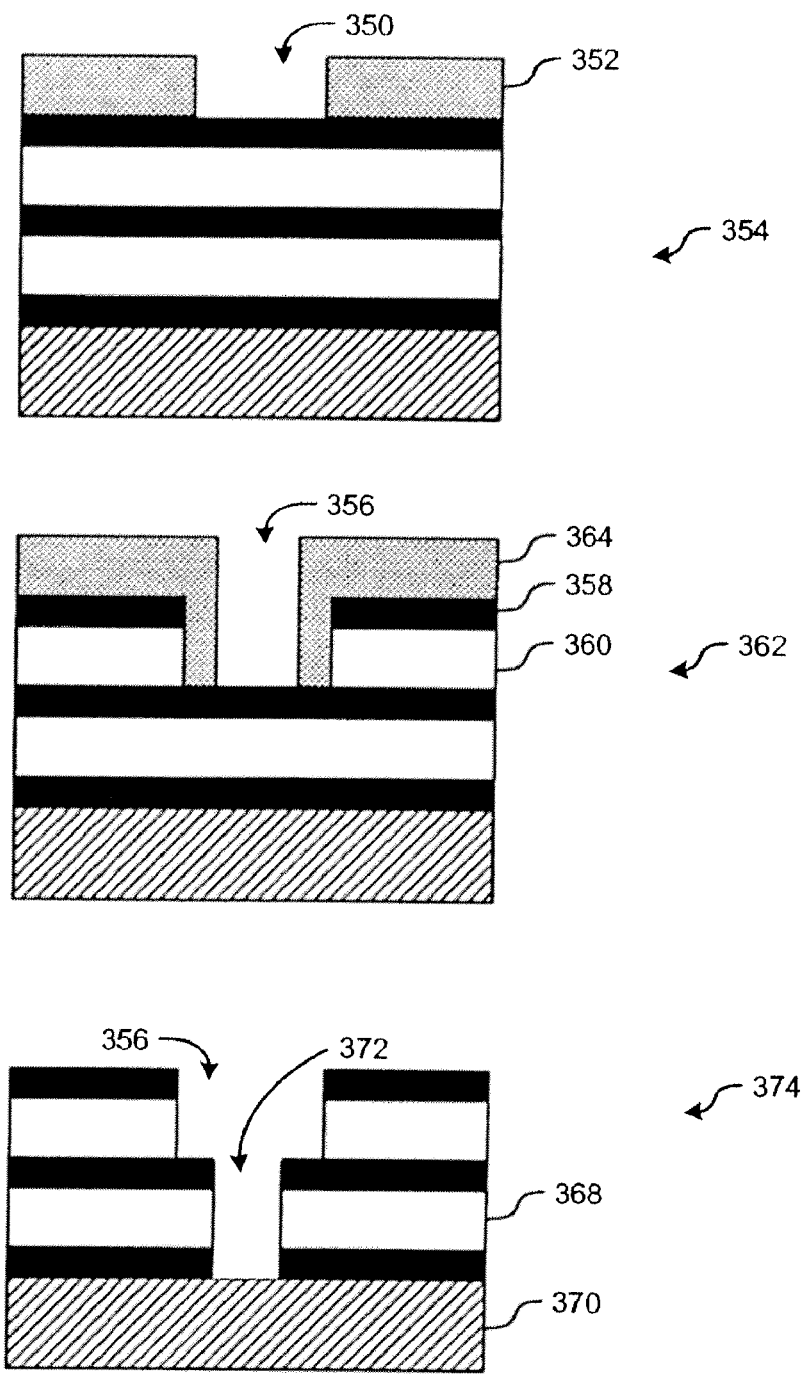
FIG. 4 is another diagram illustrating a traditional dual damascene process in accordance with the systems and methods described herein.
Figure 5:
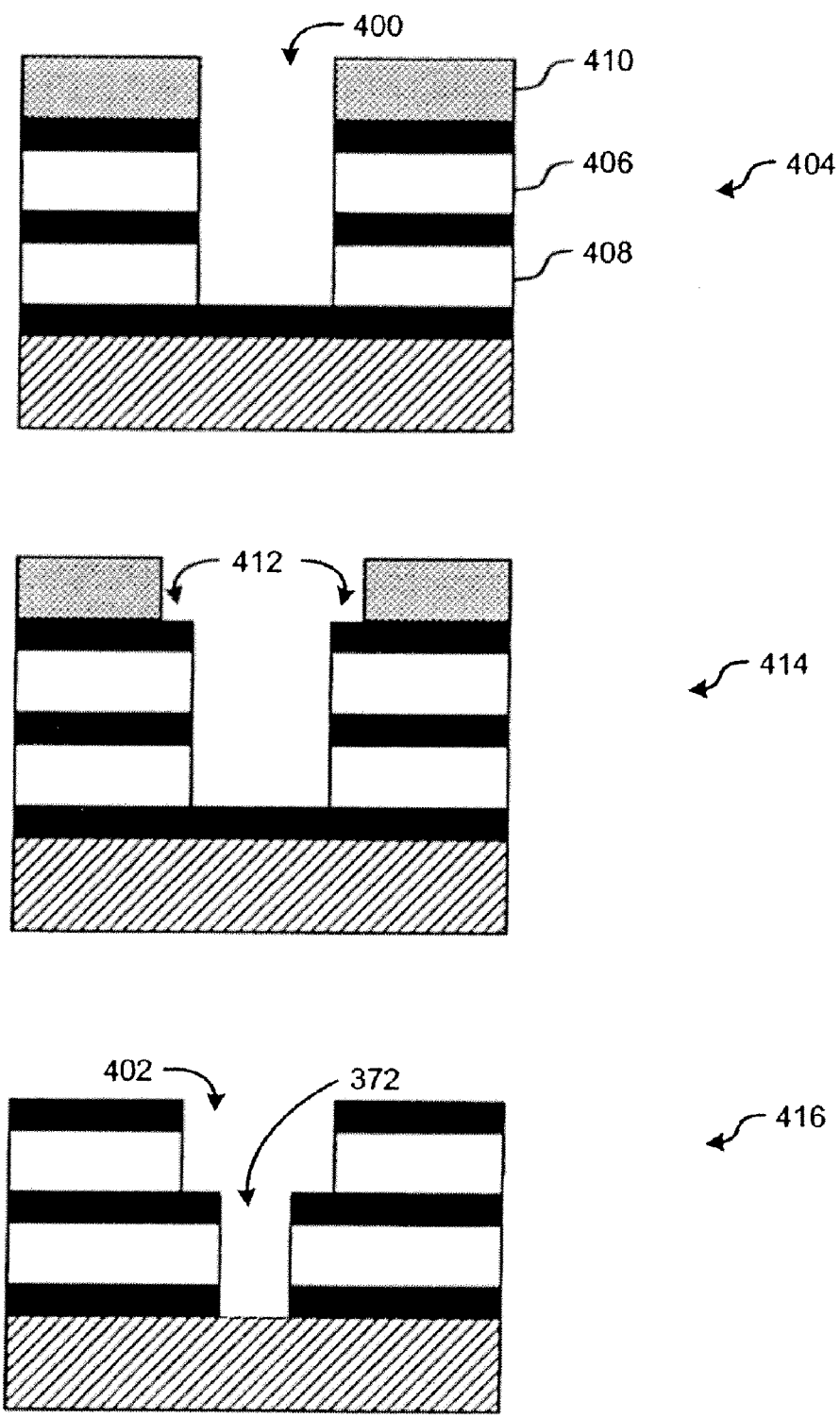
FIG. 5 is another diagram illustrating a traditional dual damascene process in accordance with the systems and methods described herein.

FIGS. 3-5 represent traditional dual damascene processes. Particularly, FIG. 3 illustrates a conventional stack 300 or metallization layers of a semiconductor circuit before the copper wires and vias are applied. As illustrated in FIG. 3, the stack 300 includes a semiconductor substrate 302 with a plurality of dielectric layers 304 and 306 deposited thereon. In the example illustration, only two dielectric layers 304 and 306 are shown, however, one of ordinary skill in the art will understand that additional dielectric layers can be utilized.

Also illustrated in the example of FIG. 3, are hard mask layers 308, 310, and 312 interposed between the dielectric layers 304 and 603 and between the lowermost dielectric 304 and substrate layers 302. As one of ordinary skill in the art would also appreciate, hard mask layers 308, 310, and 312 need not be utilized in the stack, but can be included to facilitate the etch process. FIG. 3 also shows a layer of photoresist 314 on the top of the stack 300. Photoresist 314 is typically used in patterning operations and can be applied and selectively removed based on the exposure to light during the photolithography process.

Using the stack 300 of FIG. 3 as an example, FIGS. 4 and 5 illustrate two alternative approaches to dual Damascene interconnects. Particularly, FIG. 4 illustrates a trench-first process, while FIG. 5 illustrates a via-first process.

As illustrated in FIG. 4, after the first lithography operation, a trench 350 is formed in the photoresist 352. In this operation, the photoresist 352 is selectively exposed to light to facilitate removal of the resist 352 in the desired area 350. This is illustrated in stack 354 of FIG. 4. After the desired portion 350 of the resist is removed, stack 354 can be etched to form a trench 356 in the top-most layers of the hard mask 358 and dielectric 360. Then, another layer of resist 364 can be applied and, through lithography, selectively removed to create an opening for the via. This is illustrated in the stack 362 of FIG. 4. With the via opening 356 in the resist, a second layer 368 of dielectric can be etched to the substrate 370 and the resist removed resulting in the trench 372 and via openings 366 as illustrated in stack 374 of FIG. 4. As described further below with reference to FIG. 6, a layer of copper can be applied and planarized create the copper wire and via structures.

As illustrated in FIG. 5, the order of the operations in FIG. 4 is altered such that the via 400 is cut first and then the trench 402. As illustrated in stack 404 of FIG. 5, after the first lithography and etch operation, a via opening 400 is cut through the first two layers of dielectric 406 and 408. Then, a layer of resist 410 is applied and, after the second lithography operation, the resist 410 is selectively removed 412 to prepare for etching of the trench 402. This is illustrated in stack 412 of FIG. 5. After the subsequent etch operation, the trench 402 and via 400 are formed in their respective dielectric layers 406 or 408 as illustrated in stack 416 of FIG. 5.

Figure 6:
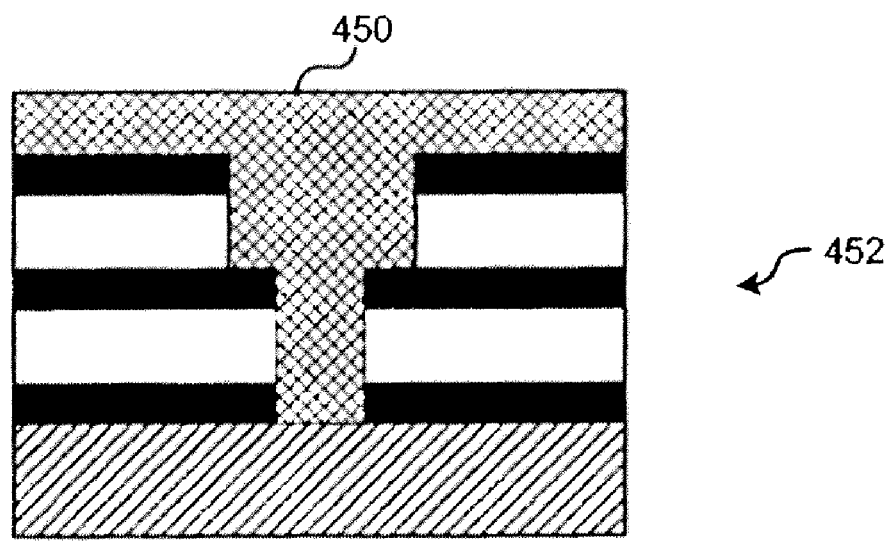
FIG. 6 is a diagram illustrating an example of metallization in accordance with the systems and methods described herein.
Figure 6:
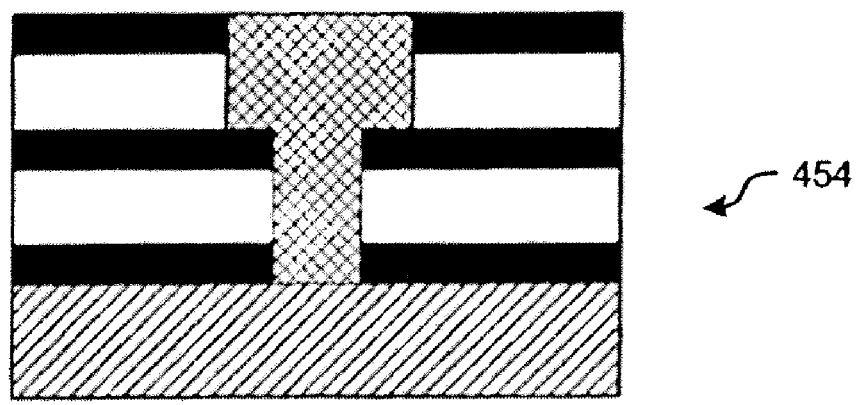

It is noted that the rightmost stacks 374 and 416 of FIGS. 5 and 6 illustrate the same resultant structure arrived at using two different approaches. With the stack prepared as illustrated at 374 in FIG. 4 and 416 in FIG. 5, the copper metallization can be applied and polished as described below with reference to FIG. 6.

As illustrated in FIG. 6, a layer of copper 450 may be applied as illustrated in stack 452 and polished, as illustrated in stack 454. The polishing may be performed using semiconductor processing operations such as, for example, chemical-mechanical polishing (CMP) to planarize the surface. Planarization can be an important step in the process because it not only removes areas of copper that are not within the trench, but it also properly prepares the surface such that topographical variations do not create difficulties in subsequent lithography operations.

Conventional dual Damascene processes can be particularly challenging especially with smaller and smaller geometries. The lithography operations can be quite challenging and there is very limited process latitude in the printing of small vias. Additionally, the overall reliability of connections between metal levels is limited by the via size. For example, the placement of the vias with respect to the metal levels becomes more and more critical as the width of the metallization lines decreases.

In one embodiment, an alternative is provided for forming an interconnect between metal levels. For example, in one application, the metal levels are configured such that they overlap to provide increased connection areas, and patches are utilized to prevent connection in areas where connections between the metal layers are not wanted. Accordingly, because increased connection areas between metal layers are utilized for connections, problems associated with alignments of the vias can be minimized or avoided, and the via level can be replaced with an easier to implement patch level that can also be of larger size than the via. Also, with a larger connection area, the device is less sensitive to misalignment between metal levels.

Figure 7:
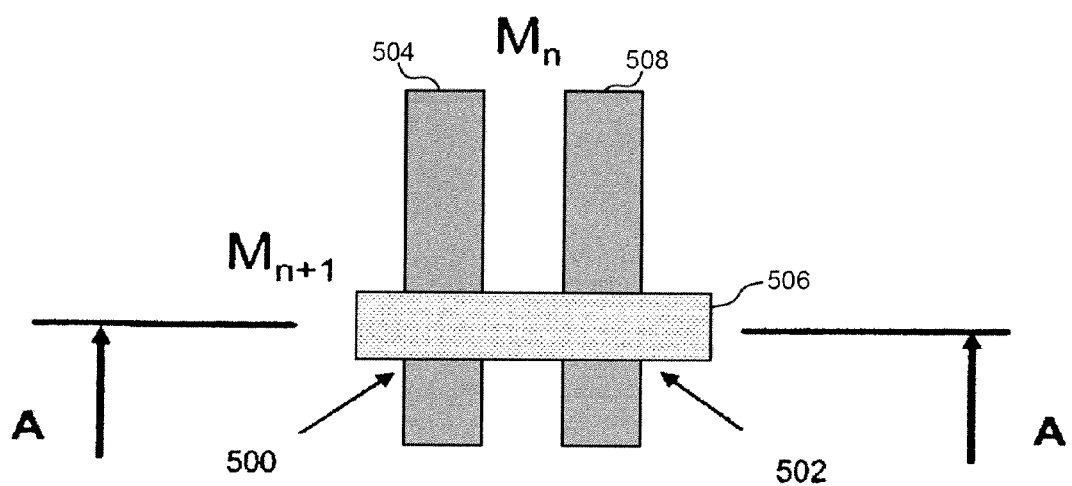
FIG. 7 is a diagram illustrating an example of conductive traces Mn and Mn+1 and an interconnect therebetween in accordance with the systems and methods described herein.

FIG. 7 is a diagram illustrating a top-down view of an example of two metallization layers Mn and Mn+1 (referred to as bottom layer Mn and top layer Mn+1) and an interconnect 500 connecting the two layers. In the example illustrated in FIG. 7, only one connection 500 is desired between the two layers. No connection is desired at location 502. As illustrated, the connection 500 is desired at the intersection between the left wire 504 on the bottom layer Mn and the top wire 506 on layer Mn+1. No connection is desired between the top wire 506 on layer Mn+1 and the bottom-right wire 508 on the bottom layer Mn.

Figure 8:
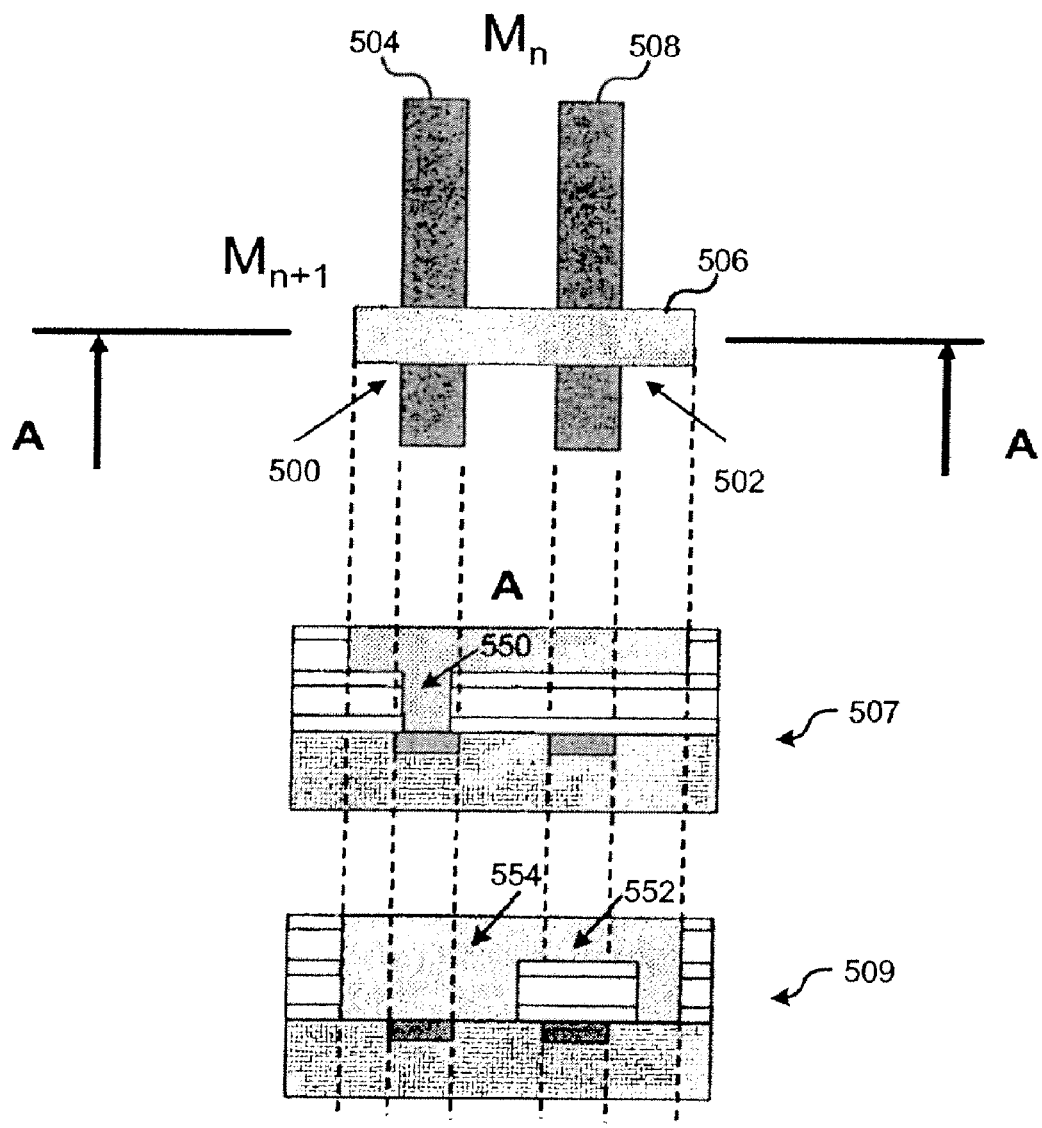
FIG. 8 is a diagram illustrating a cross-sectional view of a substrate at the center of a conductive trace in the top layer as illustrated by line A of FIG. 7.

FIG. 8 is a cross-sectional view of the substrate at the center of the wire 506 in the top layer as illustrated by line A in FIG. 7. More particularly, the stack at 507 illustrates a dual Damascene process using a conventional via 550 to make the connection, while the stack at 509 illustrates a process in accordance with one embodiment of the techniques described herein utilizing a larger interconnection area 554 and a patch 552 preventing connection between the metallization layers at overlap 502. FIG. 7 is superimposed on FIG. 8 to allow the cross sections at line A to be more easily compared to FIG. 7.

As this example illustrates, creating a larger via 554 while using a patch 552 to prevent unwanted connections in overlapping layers at 502 allows a larger contact area for interconnections connections between the metal layers than was otherwise provided with a conventional via. Depending on the device geometries, this can allow for larger mask patterns for vias and patches that are not as sensitive to lithographic limitations. For example, as illustrated the stack at 509, the sample patch 552 has dimensions larger than those of the conventional via 550, and accordingly, the patch 552 is easier to print and there is greater latitude for proper alignment.

Figure 9:
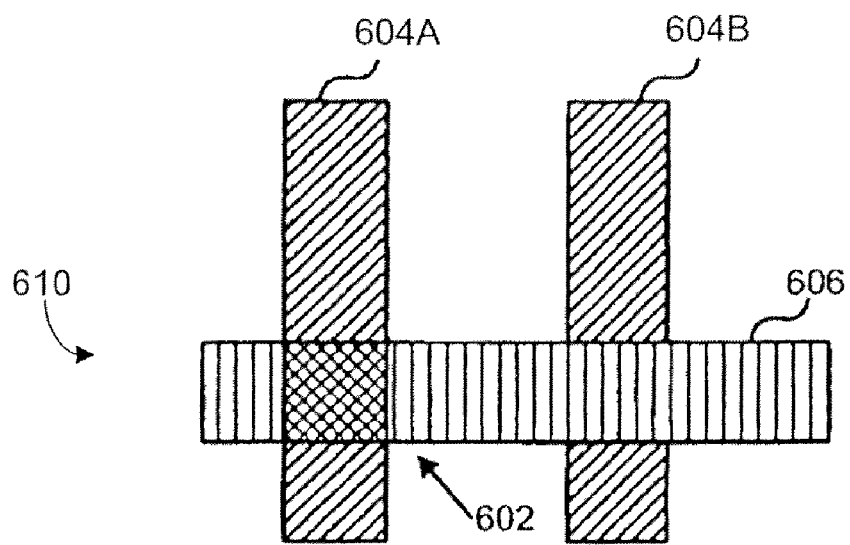
FIG. 9 is a diagram that illustrates a top view of metallization overlaps with a patch in contrast to conventional via solutions.
Figure 9:
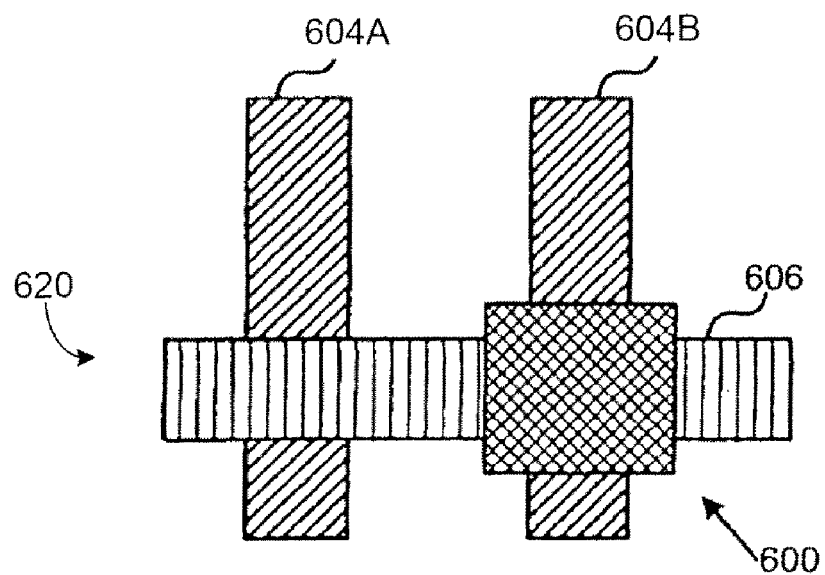

FIG. 9 illustrates a top-down view of the difference between utilizing metallization overlaps with a patch 600 and conventional via 602 solutions. Particularly, FIG. 9 illustrates a graphical representation of a data set that can be used to create the two metallization layers for traces 604 and 606 and the intermediate patch 600 or via 602 layer. As illustrated at 610, the via 602 provides an interconnection between two metallization traces 604A and 606 at the point of desired contact. As this top view illustrates, alignment of the via 602 is critical to allow sufficient contact area between traces 604A and 606 for a good connection.

In contrast, as illustrated in the example at 620, a larger via can be provided and a patch 600 used to prevent connection between traces 604B and 606. Although not shown, a larger via can be provided spanning the area between points A and B, and the patch used to insulate the traces 604B and 606 at point B. As this top view also illustrates, the patch 600 can be fabricated with a larger geometry than conventional via geometries, and therefore allows greater tolerances and device manufacturing. In the design process, in one embodiment, the intermediate via layer can still be used for the patch layer. The patch layer could be generated, for example using the Flow Mn AND Mn+1 ANDNOT Via→sizing. In another embodiment, the operation can be done using standard Boolean operations, such as those found in DRC tools.

The patch 600 generally should be larger than connection area it is blocking. For example, as illustrated in FIG. 9, the dimension of patch 600 along the x-direction is about twice the width of the metallization to be blocked in trace 604B, and in the y-direction about twice the width of the metallization to be blocked in trace 606. Accordingly, the area of the patch might be about four times larger than the area overlapped by the metallization levels illustrated in FIG. 9. Areas from 100% to 1000% or even larger as compared to the area overlapped by the pair of metallization levels, might be used. Areas smaller than 100% might also be used, depending on manufacturing tolerances, device specifications, insulating properties of the materials and so on. However, care should be taken in selecting patch dimensions to avoid an unwanted short between the metallization levels. In some embodiment patches might be 200%-600% of the unwanted overlap area.

Additionally, as illustrated in FIG. 9, the patch 600 is roughly square shaped. It will be understood by those of skill in the art that other shapes are possible and that the shape of the patch might generally be similar to the shape of the overlap between the pair of metallization levels to be blocked. This may not be true for all embodiments, however. The patch 600 should generally be large enough to block the connection. Likewise, longer patches might be used to block unwanted connections with multiple adjacent lines.

Figure 10A:
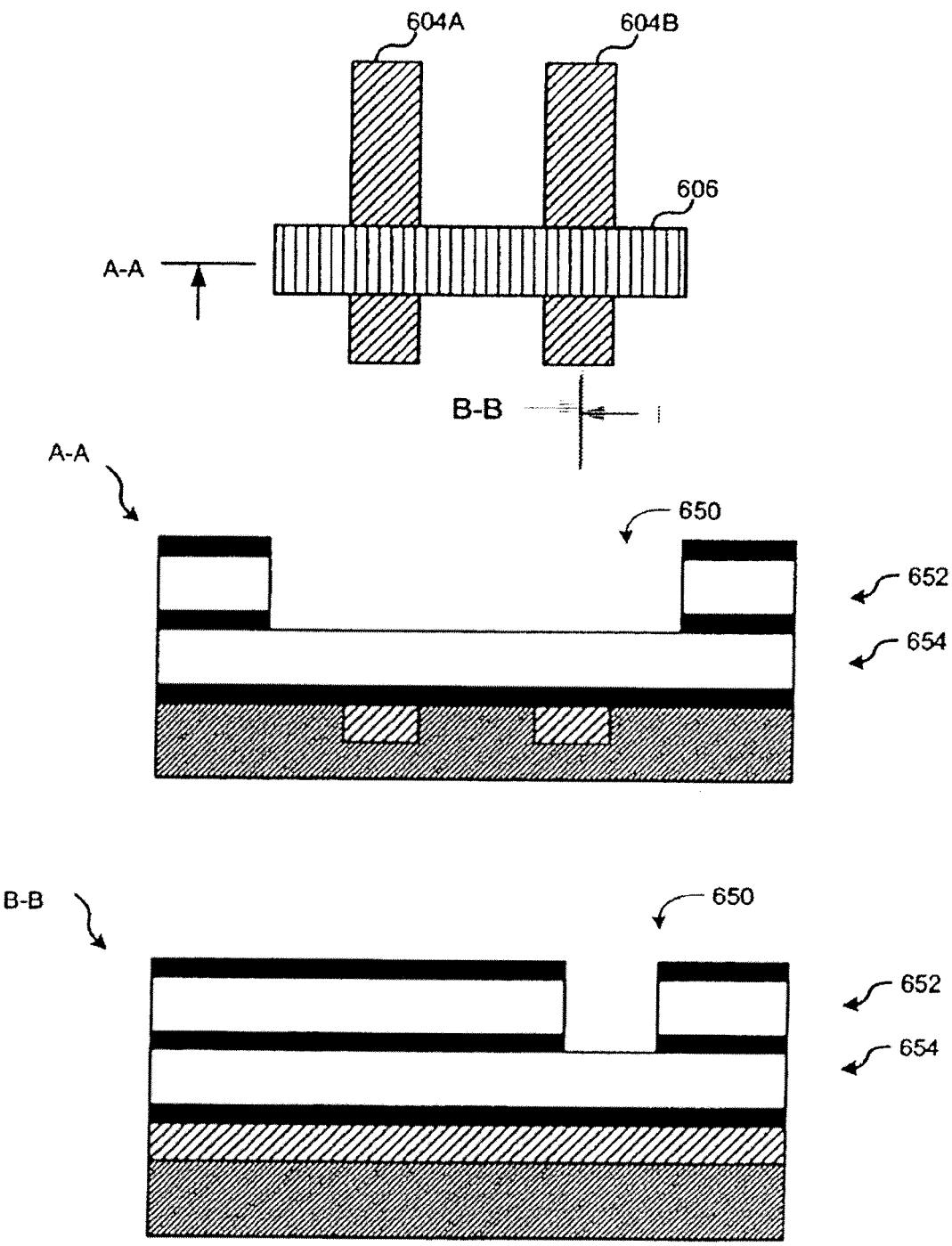
FIGS. 10A and 10B are diagrams illustrating a process flow in accordance with the systems and methods described herein.
Figure 10B:
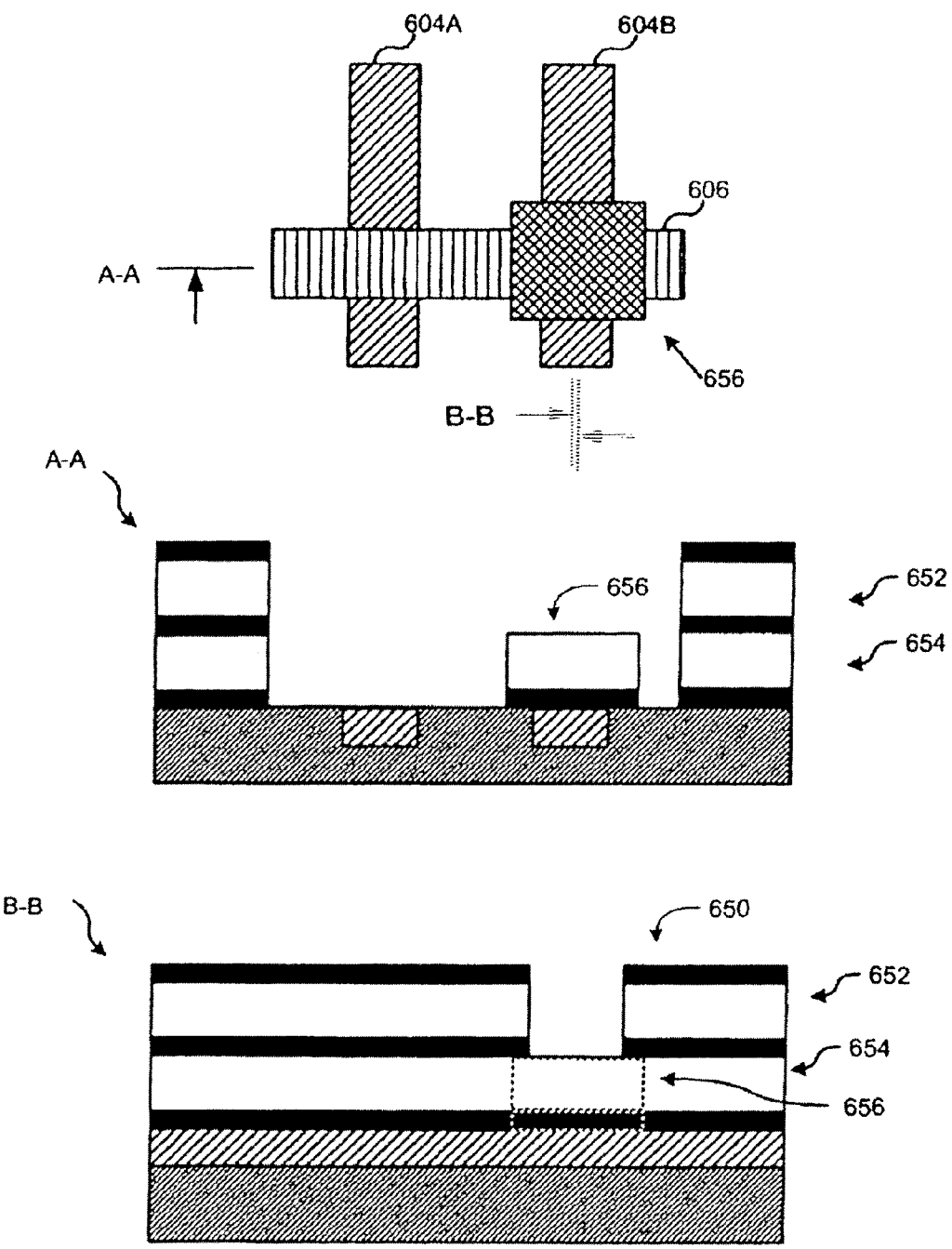

FIGS. 10A & 10B illustrate a fabrication process flow in accordance with one embodiment of the invention. FIGS. 10A and 10B illustrate points in the fabrication process for a patch such as the example patch 552 illustrated in FIGS. 9 and 10. Particularly, FIG. 10A illustrates two cross-sectional views of the first level to define a trench, while FIG. 10B illustrates two cross-sectional views of the second to define the patch. FIGS. 10A and 10B each illustrate two cross-sectional views from vantage points A-A and B-B as shown by the arrows in the top-down representation.

Referring now to FIG. 10A, the first level is etched to define the trench 650 for the top metallization layer Mn+1 652. As illustrated at A-A, the trench 650 is the length of metallization trace 606. Likewise, as illustrated at B-B, the trench 650 is the width of metallization trace 606. Accordingly, trench 650 is used to define the pattern for trace 606. Turning now to FIG. 10B, the next level is etched to etch trench 650 further to define a trench 660 to the depth of the substrate, while leaving a patch 656 in trench 660. As this shows, instead of aligning a via at the intersection of metallization traces 604A and 606 and etching the via through the intermediate layer 654, a patch 656 is defined to block a connection between the two metallization layers 604B and 606. With continued reference to FIG. 10B, illustrated at A-A is a trench the length of metallization trace 606, with patch 656 remaining in the trench. The view illustrated at B-B in FIG. 10B shows the view down the length of trench 650.

Figure 11:
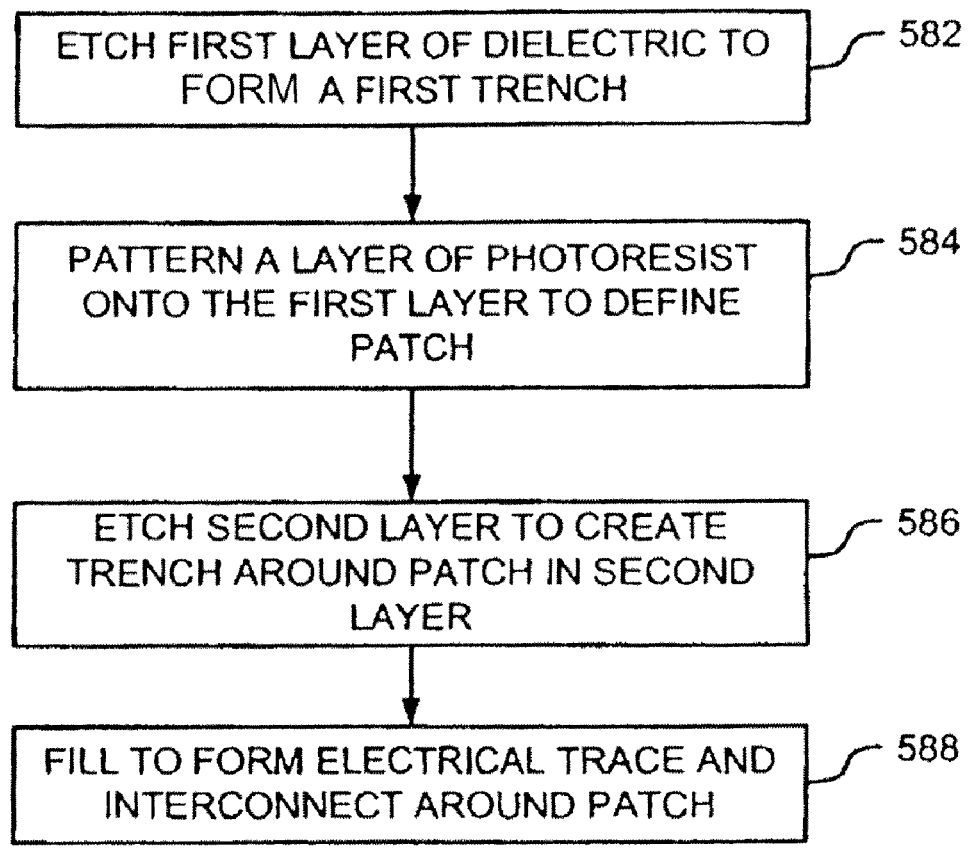
FIG. 11 is a diagram illustrating an example fabrication process for a self-aligned via in accordance with one embodiment of the invention.

FIG. 11 is an operational flow illustrating an example fabrication process for a self-aligned via in accordance with one embodiment of the invention. Referring now to FIGS. 10 and 11 in a step 582, a first layer of the semiconductor stack is etched to form a trench. In terms of the example illustrated in FIG. 10, a trench 650 is trenched into layer 652. This can be done, for example by patterning a layer of resist through lithography operations and using the resist pattern to define the etch operation.

In a step 584, a pattern for the patch etch is defined. As described above, this pattern can be larger than the overlapping area of the traces 604B, 606 it is going to insulate in at least one dimension. In the example illustrated in FIG. 10, a resist pattern 554 is used to define an area to prevent etching so that the remaining patch 656 is larger than the widths 604B, 606 where they overlap.

In a step 586, the stack is etched using the photoresist area defined in step 584 to etch the remaining material defined by the trench, while leaving the patch 656 blocked by the resist. Then, in a step 588 the trench is filled with conductive material to form the via and the conductive element. An example of this is as shown at 554 in FIG. 8.

As would be apparent to one of ordinary skill in the art after reading this description, the appropriate data can be created to utilize a combination of trenches and patches, instead of vias, in the intermediate layer. In one embodiment, processing and fabrication can be accomplished using conventional techniques including conventional dual Damascene techniques.

The term substrate can be used to refer to any material onto which a layer of material is disposed. Substrates can be comprised of any of a number of materials or combinations of materials including metals, ceramics, plastics, glass and other materials. Substrates can include semiconductor substrates such as, for example, GaAs, Si, SiGe or any other semiconductor material, and can include, for example, wafers and dice or any other semiconductor structures, including structures in the process of fabrication, having one or more layers formed thereon.

Figure 12:
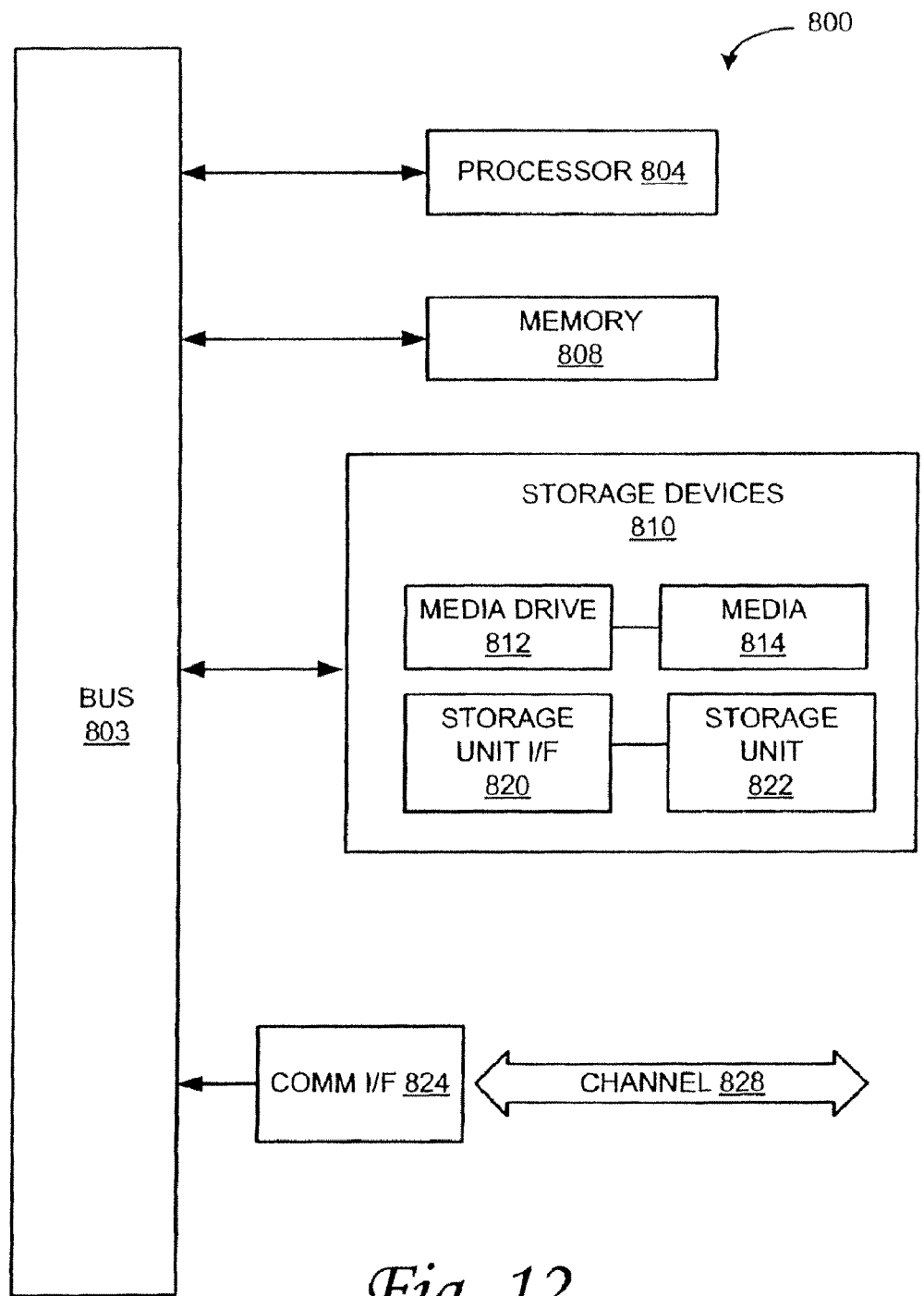
FIG. 12 is a diagram illustrating an example computing module in accordance with the systems and methods described herein.

In various embodiments, design tools can be provided and configured to create the datasets used to pattern the semiconductor layers as described herein. Such design tools can include a collection of one or more modules and can also be comprised of hardware, software or a combination thereof. Thus, for example, a tool can be a collection of one or more software modules, hardware modules, software/hardware modules or any combination or permutation thereof. As another example, a tool can be a computing device or other appliance on which software runs or in which hardware is implemented. As used herein, a module might be implemented utilizing any form of hardware, software, or a combination thereof. For example, one or more processors, controllers, ASICs, PLAs, logical components, software routines or other mechanisms might be implemented to make up a module. In implementation, the various modules described herein might be implemented as discrete modules or the functions and features described can be shared in part or in total among one or more modules. In other words, as would be apparent to one of ordinary skill in the art after reading this description, the various features and functionality described herein may be implemented in any given application and can be implemented in one or more separate or shared modules in various combinations and permutations. Even though various features or elements of functionality may be individually described or claimed as separate modules, one of ordinary skill in the art will understand that these features and functionality can be shared among one or more common software and hardware elements, and such description shall not require or imply that separate hardware or software components are used to implement such features or functionality.

Where components or modules of the invention are implemented in whole or in part using software, in one embodiment, these software elements can be implemented to operate with a computing or processing module capable of carrying out the functionality described with respect thereto. One such example-computing module is shown in FIG. 12. Various embodiments are described in terms of this example-computing module 800. After reading this description, if will become apparent to a person skilled in the relevant art how to implement the invention using other computing modules or architectures.

Referring now to FIG. 12, computing module 800 may represent, for example, computing or processing capabilities found within desktop, laptop and notebook computers; handheld computing devices (PDA's, smart phones, cell phones, palmtops, etc.); mainframes, supercomputers, workstations or servers; or any other type of special-purpose or general-purpose computing devices as may be desirable or appropriate for a given application or environment. Computing module 800 might also represent computing capabilities embedded within or otherwise available to a given device. For example, a computing module might be found in other electronic devices such as, for example, digital cameras, navigation systems, cellular telephones, portable computing devices, modems, routers, WAPs, terminals and other electronic devices that might include some form of processing capability.

Computing module 800 might include, for example, one or more processors, controllers, control modules, or other processing devices, such as a processor 804. Processor 804 might be implemented using a general-purpose or special-purpose processing engine such as, for example, a microprocessor, controller, or other control logic. In the example illustrated in FIG. 12, processor 804 is connected to a bus 802, although any communication medium can be used to facilitate interaction with other components of computing module 800 or to communicate externally.

Computing module 800 might also include one or more memory modules, simply referred to herein as main memory 808. For example, preferably random access memory (RAM) or other dynamic memory, might be used for storing information and instructions to be executed by processor 804. Main memory 808 might also be used for storing temporary variables or other intermediate information during execution of instructions to be executed by processor 804. Computing module 800 might likewise include a read only memory ("ROM") or other static storage device coupled to bus 802 for storing static information and instructions for processor 804.

The computing module 800 might also include one or more various forms of information storage mechanism 810, which might include, for example, a media drive 812 and a storage unit interface 820. The media drive 812 might include a drive or other mechanism to support fixed or removable storage media 814. For example, a hard disk drive, a floppy disk drive, a magnetic tape drive, an optical disk drive, a CD or DVD drive (R or RW), or other removable or fixed media drive might be provided. Accordingly, storage media 814, might include, for example, a hard disk, a floppy disk, magnetic tape, cartridge, optical disk, a CD or DVD, or other fixed or removable medium that is read by, written to or accessed by media drive 812. As these examples illustrate, the storage media 814 can include a computer usable storage medium having stored therein computer software or data.

In alternative embodiments, information storage mechanism 810 might include other similar instrumentalities for allowing computer programs or other instructions or data to be loaded into computing module 800. Such instrumentalities might include, for example, a fixed or removable storage unit 822 and an interface 820. Examples of such storage units 822 and interfaces 820 can include a program cartridge and cartridge interface, a removable memory (for example, a flash memory or other removable memory module) and memory slot, a PCMCIA slot and card, and other fixed or removable storage units 822 and interfaces 820 that allow software and data to be transferred from the storage unit 822 to computing module 800.

Computing module 800 might also include a communications interface 824. Communications interface 824 might be used to allow software and data to be transferred between computing module 800 and external devices. Examples of communications interface 824 might include a modem or softmodem, a network interface (such as an Ethernet, network interface card, WiMedia, IEEE 802.XX or other interface), a communications port (such as for example, a USB port, IR port, RS232 port Bluetooth® interface, or other port), or other communications interface. Software and data transferred via communications interface 824 might typically be carried on signals, which can be electronic, electromagnetic (which includes optical) or other signals capable of being exchanged by a given communications interface 824. These signals might be provided to communications interface 824 via a channel 828. This channel 828 might carry signals and might be implemented using a wired or wireless communication medium. These signals can deliver the software and data from memory or other storage medium in one computing system to memory or other storage medium in computing system 800. Some examples of a channel might include a phone line, a cellular link, an RF link, an optical link, a network interface, a local or wide area network and other wired or wireless communications channels.

In this document, the terms "computer program medium" and "computer usable medium" are used to generally refer to physical storage media such as, for example, memory 808, storage unit 820, and media 814. These and other various forms of computer program media or computer usable media may be involved in storing one or more sequences of one or more instructions to a processing device for execution. Such instructions embodied on the medium, are generally referred to as "computer program code" or a "computer program product" (which may be grouped in the form of computer programs or other groupings). When executed, such instructions might enable the computing module 800 to perform features or functions of the present invention as discussed herein.

While various embodiments of the present invention have been described above, it should be understood that they have been presented by way of example only, and not of limitation. Likewise, the various diagrams may depict an example architectural or other configuration for the invention, which is done to aid in understanding the features and functionality that can be included in the invention. The invention is not restricted to the illustrated example architectures or configurations, but the desired features can be implemented using a variety of alternative architectures and configurations. Indeed, it will be apparent to one of skill in the art how alternative functional, logical or physical partitioning and configurations can be implemented to implement the desired features of the present invention. Also, a multitude of different constituent module names other than those depicted herein can be applied to the various partitions. Additionally, with regard to flow diagrams, operational descriptions and method claims, the order in which the steps are presented herein shall not mandate that various embodiments be implemented to perform the recited functionality in the same order unless the context dictates otherwise.

Although the invention is described above in terms of various exemplary embodiments and implementations, it should be understood that the various features, aspects and functionality described in one or more of the individual embodiments are not limited in their applicability to the particular embodiment with which they are described, but instead can be applied, alone or in various combinations, to one or more of the other embodiments of the invention, whether or not such embodiments are described and whether or not such features are presented as being a part of a described embodiment. Thus, the breadth and scope of the present invention should not be limited by any of the above-described exemplary embodiments.

Terms and phrases used in this document, and variations thereof, unless otherwise expressly stated, should be construed as open ended as opposed to limiting. As examples of the foregoing: the term "including" should be read as meaning "including, without limitation" or the like; the term "example" is used to provide exemplary instances of the item in discussion, not an exhaustive or limiting list thereof, the terms should be read as meaning "at least one," "one or more" or the like; and adjectives such as "conventional," "traditional," "normal," "standard," "known" and terms of similar meaning should not be construed as limiting the item described to a given time period or to an item available as of a given time, but instead should be read to encompass conventional, traditional, normal, or standard technologies that may be available or known now or at any time in the future. Likewise, where this document refers to technologies that would be apparent or known to one of ordinary skill in the art, such technologies encompass those apparent or known to the skilled artisan now or at any time in the future.

The presence of broadening words and phrases such as "one or more," "at least," "but not limited to" or other like phrases in some instances shall not be read to mean that the narrower case is intended or required in instances where such broadening phrases may be absent. The use of the term "module" does not imply that the components or functionality described or claimed as part of the module are all configured in a common package. Indeed, any or all of the various components of a module, whether control logic or other components, can be combined in a single package or separately maintained and can further be distributed in multiple groupings or packages or across multiple locations.

Additionally, the various embodiments set forth herein are described in terms of exemplary block diagrams, flow charts and other illustrations. As will become apparent to one of ordinary skill in the art after reading this document, the illustrated embodiments and their various alternatives can be implemented without confinement to the illustrated examples. For example, block diagrams and their accompanying description should not be construed as mandating a particular architecture or configuration.

What is claimed is:

1. A method of manufacturing a semiconductor having a plurality of layers and having a first conductive trace on a first layer electrically connected to a second conductive trace on a second layer and electrically isolated from a third electrical trace on the second layer, the method comprising:

forming a semiconductor structure comprising first, second and third layers;

etching a first conducting layer to form a first trench for the first conductive trace;

patterning a layer of material on the second layer in the first trench to define a patch area on the second layer, wherein the patch area is disposed in a location at which the first trench crosses over the third electrical trace; and etching a second trench in the second layer in an area defined by the first trench and the patch area to remove material in the second layer exposed by the first trench while leaving material of the layer under the patch area.

2. The method of claim 1, further comprising filling the first and second trenches with conductive material to form the first conductive trace and an interconnect between the first and second conductive traces.

3. The method of claim 2, wherein the patch area provides electrical isolation between the conductive material in the first and second trenches and the third conductive trace in the third layer.

4. The method of claim 1, wherein the patch area comprises an area approximately 400% of the area of overlap between the first and third electrical traces.

5. The method of claim 1, wherein the patch area comprises an area in the range of approximately 150% to 800% of the area of overlap between the first and third electrical traces.

6. The method of claim 1, wherein the first layer further comprises a hardmask layer disposed thereon and the hardmask layer confines the step of etching the second trench to the area defined by the first trench.

7. A method of manufacturing a semiconductor device having a plurality of layers and having a first conductive trace on a first layer electrically connected to a second conductive trace on a second layer and electrically isolated from a third electrical trace on the second layer, the method comprising:

patterning a first conductive element on the first layer of a semiconductor device;

patterning second and third conductive elements on the second layer of a semiconductor device;

forming a patch at a predetermined location between the first and third conductive elements; and forming an electrical connection in the second layer of the semiconductor device at a predetermined location between the first and the second conductive element, wherein the patch limits an extent of the electrical connection thereby electrically isolating the first and third conductive elements.

8. The method of claim 7, wherein the steps of patterning and forming comprise:

etching the first conducting layer to form a first trench for the first conductive trace;

patterning a layer of material on the second layer in the first trench to define a patch area on the second layer, wherein the patch area is disposed in a location at which the first trench crosses over the third electrical trace;

etching a second trench in the second layer in an area defined by the first trench and the patch area to remove material in the second layer exposed by the first trench while leaving material of the layer under the patch area; and filling the first and second trenches with conductive material to form the first conductive trace and an interconnect between the first and second conductive traces.

* * * * *

UNITED STATES PATENT AND TRADEMARK OFFICE
CERTIFICATE OF CORRECTION

| | | |
|---|---|---|
| PATENT NO. | : 8,252,693 B1 | Page 1 of 1 |
| APPLICATION NO. | : 13/015514 | |
| DATED | : August 28, 2012 | |
| INVENTOR(S) | : Christophe Pierrat | |

It is certified that error appears in the above-identified patent and that said Letters Patent is hereby corrected as shown below:

Col. 3, line 24, delete "materiel" and insert --material--.

Col. 8, line 27, delete "embodiment" and insert --embodiments--.

Col. 10, line 8, delete "if" and insert --it--.

Col. 12, line 23, after "terms", insert --"a" or "an"--.

Signed and Sealed this
Thirteenth Day of November, 2012

David J. Kappos
*Director of the United States Patent and Trademark Office*